(12) United States Patent
Kim et al.

(10) Patent No.: US 9,111,887 B2
(45) Date of Patent: Aug. 18, 2015

(54) FLEXIBLE DISPLAY APPARATUS AND METHOD OF MANUFACTURING THE SAME

(75) Inventors: Mu-Gyeom Kim, Yongin (KR);
Kyung-Ho Kim, Yongin (KR);
Joon-Hyuk Cho, Yongin (KR); Sun-Ho Kim, Yongin (KR); Ji-Won Han, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 87 days.

(21) Appl. No.: 13/588,814

(22) Filed: Aug. 17, 2012

(65) Prior Publication Data

US 2013/0248867 A1    Sep. 26, 2013

(30) Foreign Application Priority Data

Mar. 23, 2012  (KR) ........................ 10-2012-0030031

(51) Int. Cl.
*H01L 27/32* (2006.01)
*H01L 51/52* (2006.01)

(52) U.S. Cl.
CPC ........ *H01L 27/3246* (2013.01); *H01L 51/5253* (2013.01); *H01L 51/5256* (2013.01); *H01L 2251/5338* (2013.01)

(58) Field of Classification Search
CPC .......................... H01L 51/5253; H01L 27/3246
USPC ...................... 257/59, 40, E51.018
See application file for complete search history.

(56) References Cited

U.S. PATENT DOCUMENTS

| | | | |
|---|---|---|---|
| 7,641,531 B2 * | 1/2010 | Yamazaki ........................ 445/24 |
| 7,834,547 B2 | 11/2010 | Kwon | |
| 7,863,811 B2 | 1/2011 | Jun et al. | |
| 2005/0218792 A1 * | 10/2005 | Jianpu et al. ................... 313/502 |
| 2008/0318034 A1 * | 12/2008 | Murakami et al. ............. 428/336 |

FOREIGN PATENT DOCUMENTS

| KR | 10-2008-0004385 | 1/2008 |
| KR | 10-0796618 | 1/2008 |
| KR | 10-0833773 B1 | 5/2008 |
| KR | 10-0838090 | 6/2008 |
| KR | 10-2011-0056898 A | 5/2011 |

* cited by examiner

*Primary Examiner* — Amar Movva
(74) *Attorney, Agent, or Firm* — Christie, Parker & Hale, LLP (57) ABSTRACT

A flexible display apparatus and a method of manufacturing the flexible display apparatus are disclosed. A flexible organic light-emitting display apparatus includes: a thin film transistor formed on a substrate in which a plurality of subpixels are located; an organic light-emitting device electrically connected to the thin film transistor and in one of the subpixels, the organic light-emitting device including a first electrode, an organic layer on the first electrode; and a second electrode on the organic layer; a pixel defining layer having an opening that exposes at least a region of the first electrode, and covering an edge region of the first electrode; a capping layer covering the organic light-emitting device; and at least one clamp unit in a non-organic layer region defined next to the one of the subpixels, wherein the non-organic layer region is a region in which the organic layer is not formed.

16 Claims, 8 Drawing Sheets

FLEXIBLE DISPLAY APPARATUS AND METHOD OF MANUFACTURING THE SAME

CROSS-REFERENCE TO RELATED PATENT APPLICATION

This application claims priority to and the benefit of Korean Patent Application No. 10-2012-0030031, filed on Mar. 23, 2012, in the Korean Intellectual Property Office, the entire content of which is incorporated herein by reference.

BACKGROUND

1. Field

Aspects of embodiments of the present invention relate to a flexible display apparatus.

2. Description of the Related Art

In general, organic light-emitting devices (OLEDs), such as organic light emitting diodes, are applicable in electronic/electric products, such as digital cameras, video cameras, camcorders, portable information terminals, smart phones, slim laptops, tablet personal computers, mobile display apparatuses, such as flexible display apparatuses, and ultra-slim televisions. Research and development of flexible display devices that are portable display devices for mobile devices and are applicable in apparatuses having a variety of shapes is in progress. In particular, flexible display apparatuses based on organic light-emitting display technology are most promising.

However, when a flexible display device is subject to significant stress (for example, folding, bending, or rolling) in a direction, thin film layers on a panel of the display device may be separated from one another by the stress. In particular, separation of thin film layers on and below an organic layer region may occur. Therefore, there is a benefit to increasing adhesion strength between the thin film layers in the flexible display device.

SUMMARY

Aspects of embodiments of the present invention relate to a flexible display apparatus and, more particularly, to a flexible display apparatus capable of preventing or reducing separation between thin film layers, and a method of manufacturing the flexible display apparatus. One embodiment of the present invention provides for a flexible display device having a clamp unit structure for binding upper and lower thin film layers with improved adhesion, and a method of manufacturing the flexible display device.

In an exemplary embodiment according to the present invention, an organic light-emitting display apparatus including a plurality of subpixels on a substrate is provided. The organic light-emitting display apparatus includes: a thin film transistor on the substrate; an organic light-emitting device electrically connected to the thin film transistor and in one of the subpixels, the organic light-emitting device including a first electrode, an organic layer on the first electrode, and a second electrode on the organic layer; a pixel defining layer having an opening that exposes at least a region of the first electrode, and covering an edge region of the first electrode; a capping layer covering the organic light-emitting device; and at least one clamp unit in a non-organic layer region defined next to the one of the subpixels. The non-organic layer region is a region in which the organic layer is not formed.

The at least one clamp unit may be on a surface region of the pixel defining layer that surrounds the one of the subpixels and is buried by the capping layer, the surface region being an exposed region on which the organic layer is not formed.

The at least one clamp unit may have an inverse tapered shape with a negative side slope.

The at least one clamp unit may have a cross-sectional area decreasing from a first surface toward a second surface that is vertically opposite to the first surface and contacts the pixel defining layer.

The at least one clamp unit may have a first surface, a second surface that is vertically opposite to the first surface and contacts the pixel defining layer, a widest portion between the first surface and the second surface, and a cross-sectional area decreasing from the widest portion toward the second surface.

A gap exposing the surface region of the pixel defining layer may be between the organic layer and the at least one clamp unit. The gap may be filled with the capping layer so that the pixel defining layer and the capping layer are connected to each other.

The capping layer may be formed by atomic layer deposition.

The capping layer may be a hybrid layer of alternating organic and inorganic material layers.

The organic light-emitting display apparatus may further include a protection layer under the pixel defining layer to planarize an upper surface of the thin film transistor. The non-organic layer region may be an exposed surface region of the protection layer in which the pixel defining layer is not present.

The pixel defining layer and the at least one clamp unit may be formed in a same layer.

The at least one clamp unit may be on the exposed surface region of the protection layer, and may be buried by the capping layer.

The at least one clamp unit may have an inverse tapered shape with a negative side slope.

The at least one clamp unit may have a cross-sectional area decreasing from a first surface toward a second surface that is vertically opposite to the first surface and contacts the protection layer.

The at least one clamp unit may have a first surface, a second surface that is vertically opposite to the first surface and contacts the protection layer, a widest portion between the first surface and the second surface, and a cross-sectional area decreasing from the widest portion toward the second surface.

A gap exposing the surface region of the protection layer may be between the pixel defining layer and the at least one clamp unit, and may be filled with the capping layer so that the pixel defining layer, the capping layer, and the protection layer are connected to one another.

The pixel defining layer may define the subpixels. The at least one clamp unit may be at a corner of each of adjacent ones of the subpixels.

The pixel defining layer may define the subpixels. The at least one clamp unit may be between adjacent ones of the subpixels.

The organic light-emitting display apparatus may further include a plurality of pixels on the substrate, each of the pixels including a red one of the subpixels, a green one of the subpixels, and a blue one of the subpixels. The pixel defining layer may be between adjacent ones of the subpixels. The at least one clamp unit may be between adjacent ones of the pixels.

According to another exemplary embodiment of the present invention, a method of manufacturing an organic light-emitting display apparatus including a plurality of subpixels on a substrate is provided. The method includes: forming a first electrode on a substrate having a thin film transistor; forming a pixel defining layer that has an opening exposing at least a region of the first electrode, and covers an edge region of the first electrode; forming at least one clamp unit next to one of the subpixels; forming a second electrode on the first electrode as a common layer of an organic layer and the subpixels; and forming a capping layer on the substrate to cover an organic light-emitting device including the first electrode, the organic layer, and the second electrode.

The at least one clamp unit may be formed on a surface region of the pixel defining layer that corresponds to a non-organic layer region in which the organic layer is not formed.

The at least one clamp unit may be formed to have an inverse tapered shape with a negative side slope.

The at least one clamp unit may be formed to have a cross-sectional area decreasing from a first surface toward a second surface that is vertically opposite to the first surface and contacts the pixel defining layer.

The at least one clamp unit may be formed to have a first surface, a second surface that is vertically opposite to the first surface and contacts the pixel defining layer, a widest portion between the first surface and the second surface, and a cross-sectional area decreasing from the widest portion toward the second surface.

A gap exposing the surface region of the pixel defining layer may be between the organic layer and the at least one clamp unit. The gap may be filled with the capping layer so that the pixel defining layer and the capping layer are connected to each other.

The method may further include forming a protection layer under the pixel defining layer to planarize an upper surface of the thin film transistor. The at least one clamp unit may be formed in a non-organic layer region that corresponds to an exposed surface region of the protection layer in which the pixel defining layer is not present.

The at least one clamp unit may be formed to have an inverse tapered shape with a negative side slope.

The at least one clamp unit may be formed to have a cross-sectional area decreasing from a first surface toward a second surface that is vertically opposite to the first surface and contacts the protection layer.

The at least one clamp unit may be formed to have a first surface, a second surface that is vertically opposite to the first surface and contacts the protection layer, a widest portion between the first surface and the second surface, and a cross-sectional area decreasing from the widest portion toward the second surface.

A gap exposing the surface region of the protection layer may be between the pixel defining layer and the at least one clamp unit. The gap may be filled with the capping layer so that the pixel defining layer, the capping layer, and the protection layer are connected to each other.

The capping layer may be formed by atomic layer deposition.

BRIEF DESCRIPTION OF THE DRAWINGS

The above and other features and aspects of the present invention will become more apparent by describing in detail exemplary embodiments thereof with reference to the attached drawings in which:

FIGS. 3A to 3F are cross-sectional views sequentially illustrating steps of a process for forming the organic light-emitting device and the clamp units of FIG. 1 according to an embodiment of the present invention;

DETAILED DESCRIPTION

As used herein, the term "and/or" includes any and all combinations of one or more of the associated listed items. Expressions such as "at least one of," when preceding a list of elements, modify the entire list of elements and do not modify the individual elements of the list.

As the present invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the following description of the present invention, a detailed description of disclosed functions or structures will not be provided if, for example, they are well understood by one of ordinary skill in the art or make features of the invention obscure.

While such terms as "first," "second," etc., may be used to describe various components, such components need not be limited to the above terms. The above terms are used only to distinguish one component from another.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Flexible display apparatuses according to certain embodiments of the invention will be described below in more detail with reference to the accompanying drawings. Those components that are the same or similar are given the same reference numeral regardless of the figure number, and redundant explanations are not necessarily repeated.

Figure 1:
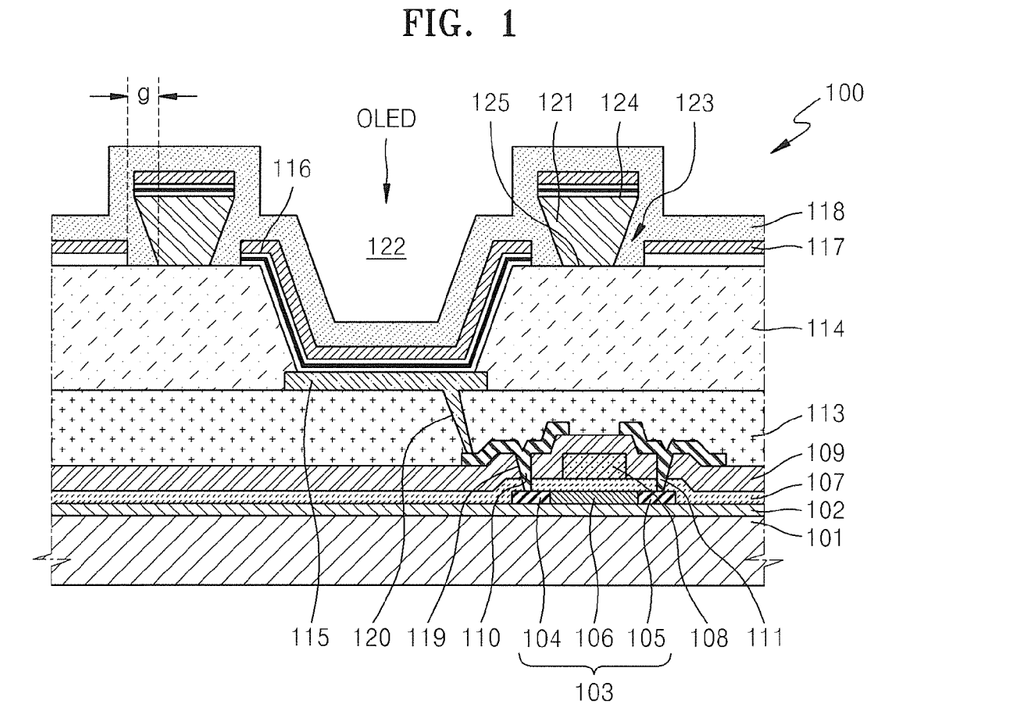
FIG. 1 is a partial cut cross-sectional view illustrating a subpixel of a flexible display device according to an embodiment of the present invention.

FIG. 1 is a cross-sectional view schematically illustrating one subpixel in a flexible display apparatus 100 according to an embodiment of the present invention.

Although in the present embodiment of FIG. 1, a flexible organic light-emitting display apparatus is described as an example of the flexible display apparatus 100, the present invention is not limited thereto, and may apply to any flexible display apparatus that may be freely bendable.

Referring to FIG. 1, the flexible display apparatus 100 includes a substrate 101. The substrate 101 may be a flexible substrate. The substrate 101 may be formed of a material that is lighter, less fragile, and bendable as compared to glass substrates. For example, the substrate 101 may be formed of a polymer material such as a plastic film.

The smaller the thickness of the substrate 101 is, the lighter the substrate 101 may be, which may be advantageous in implementing a thin film display. However, the substrate 101 may have a thickness that provides sufficient durability for a load of elements and thin layers formed on the substrate 101.

For example, the substrate 101 may be a thin film type substrate with a thickness of from about 10 μm to about 100 μm. If the thickness of the substrate 101 is about 10 μm or less, the substrate 101 may not sufficiently support the elements and thin films formed on the substrate 101. If the thickness of the substrate 101 is about 100 μm or greater, the substrate 101 may not be sufficiently flexible. Examples of a material of the substrate 101 are polymer materials, such as polyimide (PI), polycarbonate (PC), polyethersulphone (PES), polyethylene terephthalate (PET), polyethylenenaphthalate (PEN), polyarylate (PAR), and fiber glass reinforced plastic (FRP).

A barrier layer 102 is disposed on the substrate 101. The barrier layer 102 may be formed of an inorganic material, such as SiOx, SiNx, SiON, AlO, and AlON, or an organic material, such as acryl or polyimide. The barrier layer 102 may be a stack of alternating organic and inorganic materials. The barrier layer 102 may block permeation of external oxygen and moisture and diffusion of moisture or impurities generated from the substrate 101. The barrier layer 102 may also control heat transmission rate during crystallization of a semiconductor active layer to facilitate the crystallization of the semiconductor active layer.

A thin film transistor (TFT) is disposed on the barrier layer 102. Although in the present embodiment of FIG. 1, a top gate type TFT is described as an example, the present invention may apply to any TFT structure such as a bottom gate type TFT.

When the TFT on the barrier layer 102 is a top gate type as in the present embodiment of FIG. 1, a semiconductor active layer 103, a gate insulating layer 107, a gate electrode 108, an interlayer insulating layer 109, a source electrode 110, a drain electrode 111, and a protection layer 113 may be disposed on the barrier layer 102.

The semiconductor active layer 103 having a pattern (for example, a predetermined pattern) may be disposed on the barrier layer 102. The semiconductor active layer 103 may be formed of polysilicon, which may be obtained by crystallization of amorphous silicon. A method of crystallizing amorphous silicon may be any of a variety of methods, including, for example, rapid thermal annealing (RTA), solid phase crystallization (SPC), excimer laser annealing (ELA), metal induced crystallization (MIC), metal induced lateral crystallization (MILC), and sequential lateral solidification (SLS).

A source region 104 and a drain region 105 are formed by doping the semiconductor active layer 103 with N-type or P-type impurity ions. A channel region 106 undoped with any impurity ion is between the source region 104 and the drain region 105.

The gate insulating layer 107 is disposed on the semiconductor active layer 103. The gate insulating layer 107 may be a single layer made of $SiO_2$ or may be a double layer with $SiO_2$ and SiNx layers.

The gate electrode 108 is disposed in a region (for example, a predetermined region) on the gate insulating layer 107. The gate electrode 108 is connected to a gate line (not shown) that applies a TFT ON/OFF signal. The gate electrode 108 may be formed of a single metal or multiple metals. In some embodiments, the gate electrode 108 may be formed as a single layer of Mo, MoW, Cr, Al, an Al alloy, Mg, Ni, W, or Au, or as a multi-layer of these materials in combination.

The interlayer insulating layer 109 is disposed on the gate electrode 108. Source/drain electrodes 110 and 111 are electrically connected to the source region 104 and the drain region 105, respectively, via contact holes (for example, contact hole 119 for the source electrode 110).

The interlayer insulating layer 109 may be formed of an insulating material such as $SiO_2$ or SiNx, or any insulating organic material. The contact hole 119 may be formed by selectively removing the gate insulating layer 107 and the interlayer insulating layer 109.

A protection layer (for example, a passivation layer and/or a planarization layer) 113 is disposed on the source electrode 110 and the drain electrode 111. The protection layer 113 protects and planarizes the TFT. The protection layer 113 may have any of a variety of structures. In some embodiments, the protection layer 113 may be formed as a single layer or a multi-layer including at least two layers using, for example, an organic material such as polyimide, polyamide, benzocyclobutene (BCB), acryl resin, or phenol resin, or an inorganic material such as SiNx.

A display device is disposed on the TFT. Although in the present embodiment of FIG. 1, an organic light-emitting device (OLED), such as an organic light emitting diode, is described as an example of the display device, the present invention is not limited thereto and may apply to any of a variety of display devices.

To form the OLED, a first electrode 115 is disposed on the TFT to be electrically connected with one of the source electrode 110 or the drain electrode 111 through the contact hole 120. The first electrode 115, which serves as an anode of the OLED, may be formed of any of a variety of conductive materials. The first electrode 115 may be formed as a transparent electrode or as a reflective electrode depending on the structure of the OLED.

For example, when formed as a transparent electrode, the first electrode 115 may include indium tin oxide (ITO), indium zinc oxide (IZO), zinc oxide (ZnO), or indium oxide ($In_2O_3$). When formed as a reflective electrode, the first electrode 115 may be formed of ITO, IZO, ZnO, or $In_2O_3$ on a reflective layer after formation of the reflective layer using silver (Ag), magnesium (Mg), aluminum (Al), platinum (Pt), palladium (Pd), gold (Au), nickel (Ni), neodymium (Nd), iridium (Ir), chromium (Cr), or a compound thereof.

A pixel defining layer (PDL) 114 is disposed on the protection layer 113 to cover an edge portion of the first electrode 115 of the OLED, thereby defining emission areas. The PDL 114 may be formed of an organic material or an inorganic material. In some embodiments, the PDL 114 may be formed of, for example, an organic material such as polyimide, polyamide, benzocyclobutene (BCB), acryl resin, or phenol resin, or an inorganic material such as SiNx, to have a structure of a single layer or a multi-layer including at least two layers, but is not limited thereto.

An organic layer 116 is disposed on a region of the first electrode 115 that is exposed from partially etching the PDL 114. A second electrode 117 of the OLED, which may serve as the cathode of the OLED, is disposed on the organic layer 116. The first electrode 115 and the second electrode 117 are insulated from each other by the organic layer 116, and respectively apply voltages of opposite polarities to the organic layer 116 to induce light emission in the organic layer 116.

Although in the present embodiment of FIG. 1 the organic layer 116 is illustrated as a pattern corresponding to one subpixel, i.e., on the patterned first electrode 115, for the convenience of explanation of the structure of a sub-pixel, the organic layer 116 may be formed to correspond to other adjacent subpixels. The organic layer 116 may have any of a variety of structures. In some embodiments, some layers of the organic layer 116 may be formed for each subpixel, and some other layers thereof may be formed to correspond to other adjacent subpixels. The organic layer 116 may include a low-molecular weight organic material or a polymer organic material.

Figure 2:
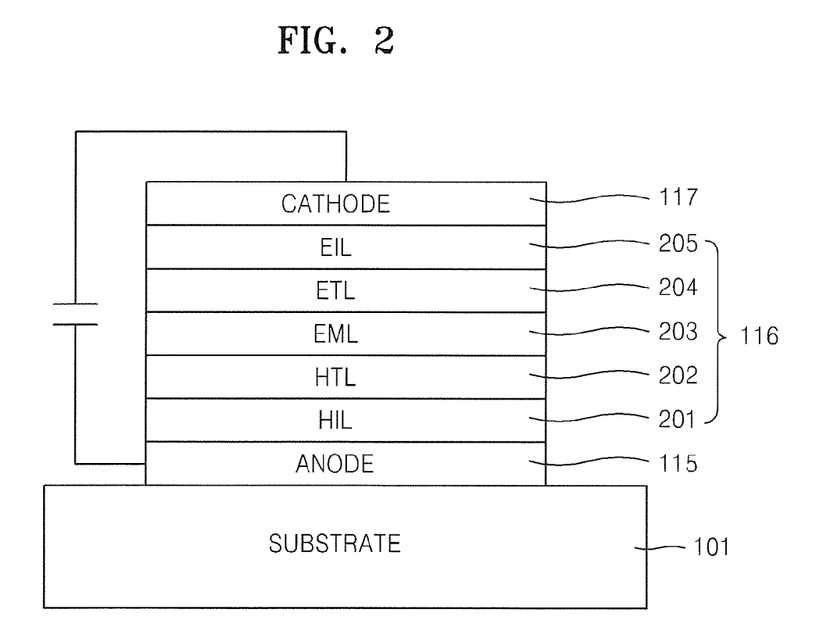
FIG. 2 illustrates a schematic structure of an exemplary organic light-emitting device of FIG. 1.

FIG. 2 illustrates a schematic structure of an exemplary organic light-emitting device OLED of FIG. 1.

As illustrated in FIG. 2, when formed of a low-molecular weight organic material, the organic layer 116 may be formed as a single- or multi-layered structure including at least one of a hole injection layer (HIL) 201, a hole transport layer (HTL) 202, an organic emission layer (EML) 203, an electron transport layer (ETL) 204, and an electron injection layer (EIL) 205. When using a low-molecular weight organic material, the organic layer 116 may be formed using, for example, vacuum deposition with masks.

When a polymer organic material is used, the organic layer 116 may have a structure including an HTL and an EML. When using a polymer organic material, the organic layer 116 may be formed using, for example, screen printing or inkjet printing. Although a variety of structures for the organic layer 116 are described above, the present invention is not limited thereto.

Referring back to FIG. 1, the second electrode 117 may be formed as a transparent electrode or as a reflective electrode, like with the first electrode 115. When the second electrode 117 is formed as a transparent electrode, the second electrode 117 may be formed by depositing a metal having a low work function, such as lithium (Li), calcium (Ca), lithium fluoride/calcium (LiF/Ca), lithium fluoride/aluminum (LiF/Al), aluminum (Al), magnesium (Mg), or a compound thereof, on the organic layer 116 and then forming an auxiliary electrode layer or a bus electrode line thereon from a transparent electrode material, such as ITO, IZO, ZnO, $In_2O_3$, or the like. When formed as a reflective electrode, the second electrode 117 may be formed depositing Li, Ca, LiF/Ca, LiF/Al, Al, Mg, or a compound thereof on the entire surface of the substrate.

When the first electrode 115 is formed as a transparent electrode or as a reflective electrode, the first electrode 115 may be formed to correspond to an opening of each sub-pixel.

The second electrode 117 may be formed by blanket deposition of a transparent electrode or a reflective electrode on the entire display region. In some embodiments, instead of being blanket deposited, the second electrode 117 may be formed as any of a variety of patterns. The positions of the first electrode 115 and the second electrode 117 may be switched.

A capping layer 118 is disposed on the OLED. The capping layer 118 may be a stack of at least one layer formed of an organic or inorganic material. For example, the capping layer 118 may have a structure including alternating inorganic and organic layers, wherein the inorganic layer may be formed of, for example, silicon oxide or silicon nitride, and the organic layer may be formed of, for example, epoxy or polyimide. However, the capping layer 118 may have any of a variety of structures, and is not limited thereto.

A non-organic layer region 123, which is a region in which the organic layer 116 is not formed, is disposed around or adjacent to each subpixel. At least one clamp unit 121 is located in the non-organic layer region 123. The PDL 114 and the capping layer 118 are at least partially connected to each other via the non-organic layer region 123. This will now be described in more detail below.

The first electrode 115 is disposed as a pattern on the protection layer 113. The first electrode 115 is electrically connected with one of the source electrode 110 or the drain electrode 111 through a contact hole 120 in the protection layer 113.

A region of the first electrode 115, i.e., an edge region of the first electrode 115, is covered by the PDL 114, and the other regions of the first electrode 115 are exposed through an opening 122. The organic layer 116 and the second electrode 117 are stacked on the region of the first electrode 115 that is exposed through the opening 122. The PDL 114, which defines each unit subpixel, determines an emission area of the OLED.

If the flexible display apparatus 100 is, for example, bent, rolled, or folded in a direction to cause a sufficient reduction in the radius of curvature, the thin film layers may separate from one another by stress. In particular, since the organic layer 116 may be formed of a material having small adhesion, separation of the organic layer 116 from the PDL 114 or from the capping layer 118 may be more likely to occur by such stress.

In a comparable technique to prevent or reduce this phenomenon, a spacer (not shown) may be formed on the PDL 114. The PDL 114 and the spacer thereon may be formed as a positive type, a portion of which may melt when exposed to light during an exposure process. In this case, the spacer has a positive (+) side slope. As a result, after formation of common layers such as the HIL 201, HTL 202, ETL 204, and EIL 205, these thin film layers that are liable to separate may be formed as continuous layers along a front side of the flexible display apparatus 100, and thus are more likely to be separated when the flexible display apparatus 100 is subjected to, for example, bending, rolling, or folding.

To prevent or reduce the separation of thin film layers in embodiments of the present invention, the clamp unit 121 may be disposed in the non-organic layer region 123 around or next to each subpixel so that a layer underlying the organic layer 116, i.e., the PDL 114, and a layer overlying the organic layer, i.e., the capping layer 118, may be connected through a region of the non-organic layer region 123 around the clamp unit 121, and without the common layers such as the HIL 201, HTL 202, ETL 204, and EIL 205 therebetween.

In further detail, the non-organic layer region 123, which is a region of the PDL 114 that excludes the organic layer 116, is disposed around or next to each subpixel. In other words, the non-organic layer region 123, which is not a pattern of the organic layer 116, is disposed on the surface of the PDL 114 defining each subpixel with the opening 122. The non-organic layer region 123 may be disposed in at least one region around or next to each subpixel, for example, at a corner of each unit subpixel, in an intersection area of adjacent subpixels, or in a region between adjacent subpixels.

The clamp unit 121 is in the non-organic layer region 123, and is buried by the capping layer 118. The clamp unit 121 has a negative (−) side slope. That is, the clamp unit 121 has an inverse tapered shape with a decreasing cross-sectional area from a first surface 124 that is an upper surface of the clamp unit 121 covered by the capping layer 118, toward a second surface 125 that is a lower surface of the clamp unit 121 and vertically opposite to the first surface 124, and directly contacts the PDL 114. In other embodiments, the clamp unit 121 may have a decreasing cross-sectional area from a middle portion (that is, a widest portion between the first surface 124 and the second surface 125) of the clamp unit 121 toward the second surface 125.

The clamp unit 121 may be formed of a material that is substantially the same as the material of the PDL 114, for example, a polymer material such as polyimide. Due to the clamp unit 121 having a negative (−) side slope, the organic layer 116 is not formed in a region adjacent to the clamp unit 121, with a gap (g) therebetween. The organic layer 116 is not disposed in a region adjacent to the clamp unit 121 for the following reasons.

Formation of the clamp unit 121 on the PDL 114 is followed by formation of the organic layer 116. The organic layer 116 may be formed by depositing an organic source material on the substrate 101. In forming the organic layer 116, since the clamp unit 121 has a cross-sectional area gradually decreasing from the first surface 124 toward the second surface 125, the organic source material for forming the organic layer 116 is unlikely to be deposited in a surface region of the PDL 114 adjacent to the second surface 125, i.e., the gap separation (g) between the clamp unit 121 and the organic layer 116.

The gap (g) is filled with the capping layer 118. The capping layer 118 may be formed using atomic layer deposition for good coverage to cover the gap (g). The gap (g) between the clamp unit 121 and the organic layer 116 is in the non-organic layer region 123 on the PDL 114, and is filled with the capping layer 118, so that the PDL 114 and the capping layer 118 are connected to each other.

The capping layer 118 may be a stack of alternating organic and inorganic material layers. This hybrid multi-layer structure of the capping layer 118 may prevent or reduce permeation of moisture.

As described above, since the clamp unit 121 is disposed in the non-organic layer region 123 that is around or next to each subpixel, allowing connection between the PDL 114 and the capping layer 118, the organic layer 116 may be supported in a vertical direction, and may be less likely to be separated than would be the case without the clamp unit 121.

FIGS. 3A to 3F are cross-sectional views sequentially illustrating processes of forming the organic light-emitting device OLED and the clamp units 121 of FIG. 1.

In the present embodiment of FIG. 1, the above-described processes of forming the barrier layer 102, the semiconductor active layer 103, the gate insulating layer 107, the gate electrode 108, the interlayer insulating layer 109, the source electrode 110, the drain electrode 111, and the protection layer 113 on the substrate 101 will not be described in further detail. Instead, the present embodiment of FIG. 1 will be described focusing primarily on forming the thin film layers on the protection layer 113.

Figure 3A:
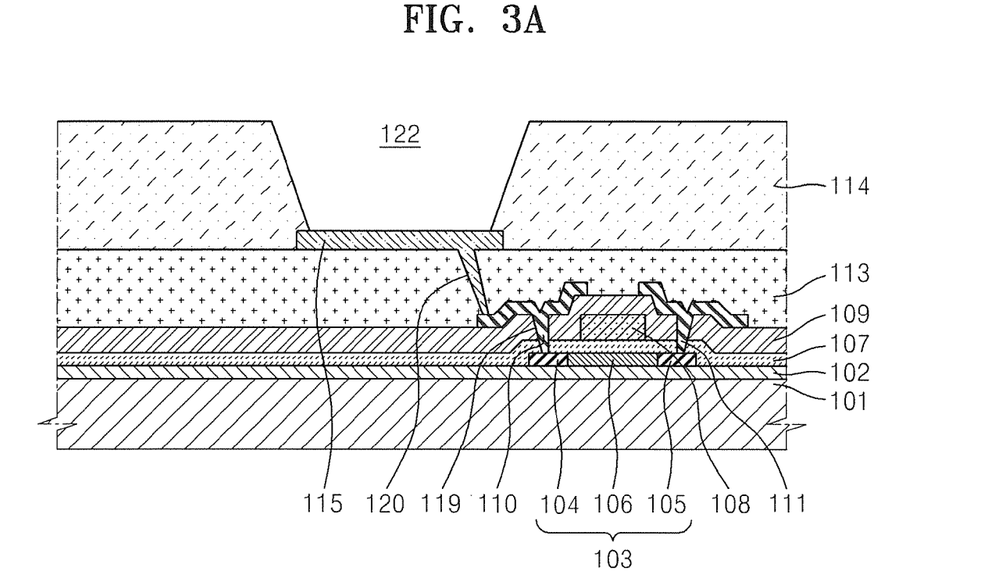
FIG. 3A is a cross-sectional view after formation of a pixel defining layer (PDL) of the subpixel of FIG. 1.

FIG. 3A is a cross-sectional view after formation of the PDL 114 of the subpixel of FIG. 1.

Referring to FIG. 3A, the first electrode 115 that is electrically connected with one of the source electrode 110 or the drain electrode 111 through the contact hole 120 is formed on the protection layer 113. The first electrode 115 may be formed as a transparent electrode or as a reflective electrode depending on the structure of the OLED.

After the formation of the first electrode 115 as a pattern (for example, a subpixel pattern), the PDL 114 is formed on the first electrode 115. The PDL 114 that covers an edge region of the first electrode 115 has an opening 122 that partially exposes the first electrode 115. The PDL 114 may be formed of an organic material such as polyimide.

Figure 3B:
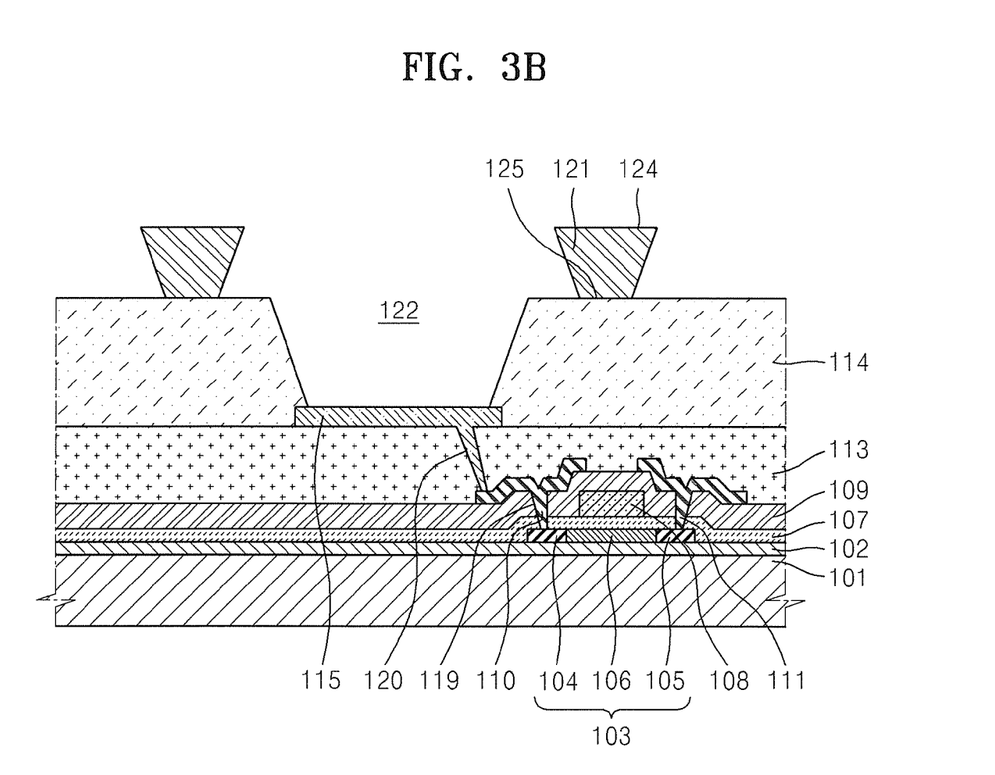
FIG. 3B is a cross-sectional view after formation of a clamp unit on the substrate of FIG. 3A.

FIG. 3B is a cross-sectional view after formation of the clamp unit 121 on the substrate of FIG. 3A.

Referring to FIG. 3B, the clamp unit 121 is formed on the PDL 114 that surrounds each subpixel. For example, several clamp units 121 may be formed next to or around each subpixel. In further detail, the clamp unit 121 has an inverse tapered shape with a decreasing cross-sectional area from the first surface 124 that is the upper surface of the clamp unit 121 toward the second surface 125 that is the lower surface of the clamp unit and vertically opposite to the first surface 124, and directly contacts the PDL 114.

In other embodiments, the clamp unit 121 may have a decreasing cross-sectional area from a middle portion (that is, a widest portion between the first surface 124 and the second surface 125) of the clamp unit 121 toward the second surface 125. The clamp unit 121 may be formed of a material that is substantially the same as the material of the PDL 114. The clamp unit 121 may be disposed in at least one region around or next to each subpixel, for example, at a corner of each unit subpixel, in an intersection area of adjacent subpixels, or in a region between adjacent subpixels, but is not limited thereto.

Figure 3C:
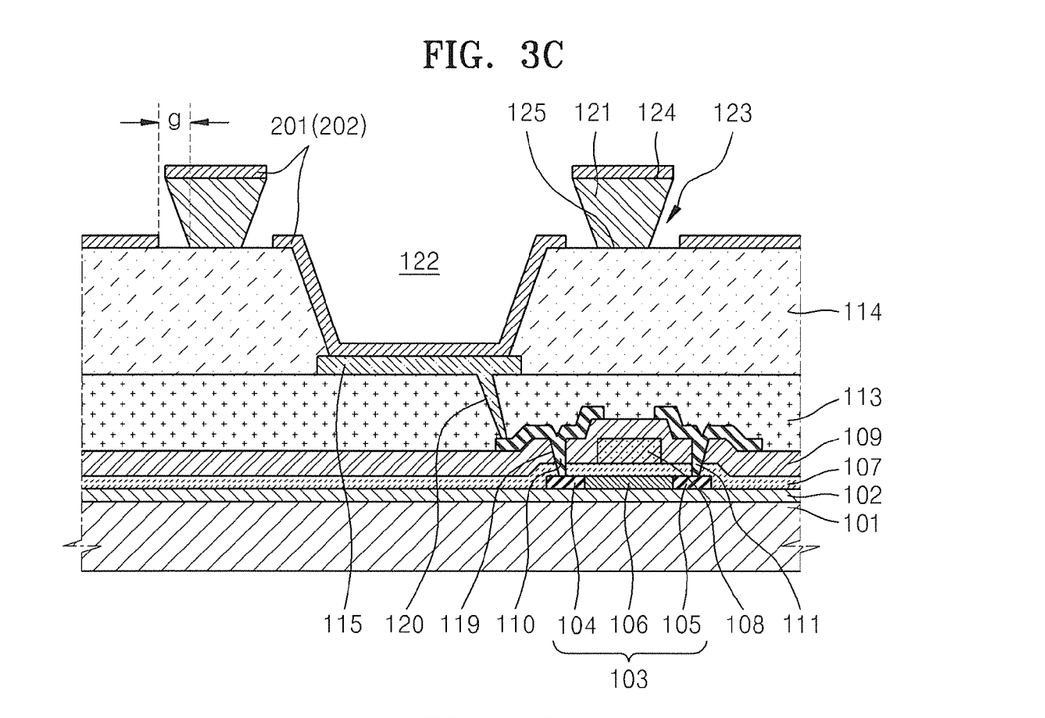
FIG. 3C is a cross-sectional view after formation of a hole injection layer (HIL) and a hole transport layer (ETL) on the substrate of FIG. 3B.

FIG. 3C is a cross-sectional view after formation of the HIL 201 and the HTL 202 on the substrate of FIG. 3B.

Referring to FIG. 3C, common layers are formed on the first electrode 115. For example, when forming the organic layer 116 from a low-molecular weight organic material, the HIL 201 and the HTL 202 may be formed as the common layers on the surface of the first electrode 115, wherein the HIL 201 and the HTL 202 used as the common layers may be formed on the entire substrate 101 without using a patterning device such as a mask. As a result, the HIL 201 and the HTL 202 are deposited on the surface of the first electrode 115 through the opening 122, on the first surface 124 of the clamp unit 121, and on the surface of the PDL 114.

The non-organic layer region 123 is formed adjacent to a side wall of the clamp unit 121, such that the HIL 201 and the HTL 202 are not deposited in the non-organic layer region 123. For example, a source material of the HIL 201 and a source material of the HTL 202 are deposited on the surface of the substrate 101 using a deposition apparatus.

Since the clamp unit 121 has an inverse tapered shape with a negative side slope, the source materials of the HIL 201 and the HTL 202 are not deposited in the region adjacent to the sidewall of the clamp unit 121. As a result, the non-organic layer region 123 is defined in the region of the upper surface of the PDL 114 that surrounds each subpixel, and the clamp unit 121 is located in the non-organic layer region 123. The gap (g) exposing the surface of the PDL 114 is between the slant sidewall of the clamp unit 121 and a region of the HIL 201 and the HTL 202.

Figure 3D:
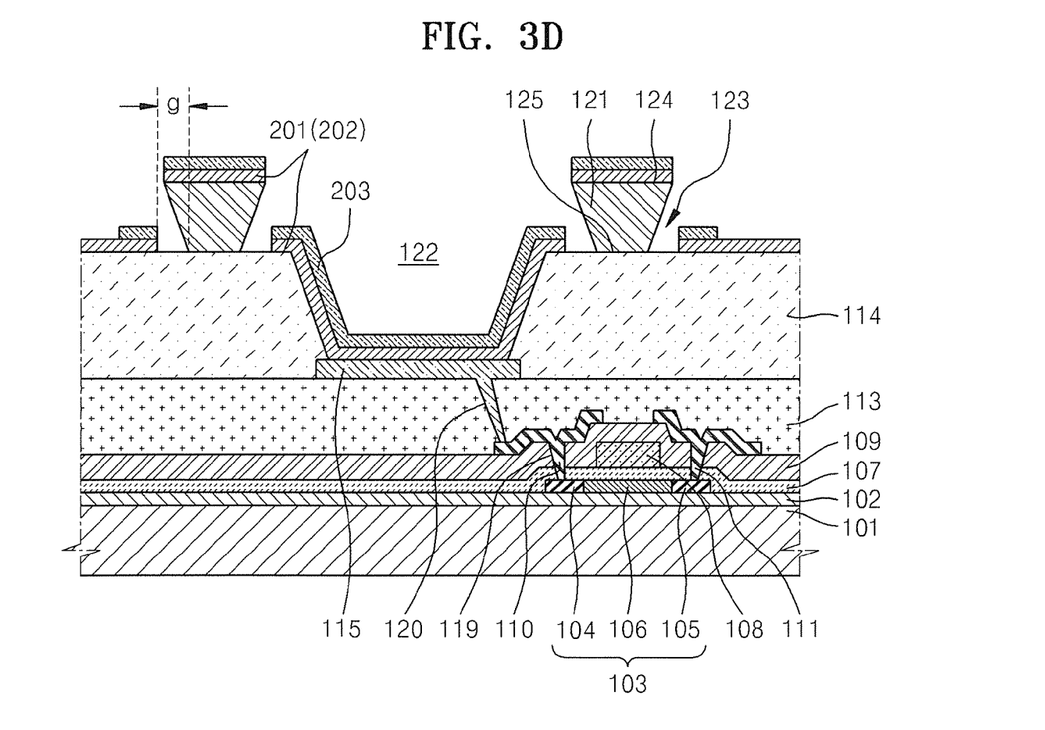
FIG. 3D is a cross-sectional view after formation of an organic emission layer (EML) on the substrate of FIG. 3C.

FIG. 3D is a cross-sectional view after formation of the EML 203 on the substrate of FIG. 3C.

Referring to FIG. 3D, the EML 203 is formed on the HIL 201 and the HTL 202. The EML 203 may be formed in each subpixel as a pattern of red, green, and blue EMLs from corresponding EML source materials using a patterning mask. The EML 203 may be formed selectively only on the HIL 201 and the HTL 202 through the opening 122, but may be formed partially on the first surface 124 of the clamp unit 121 and the surface of the PDL 114 due to the presence of the clamp unit 121. The EML 203 is not formed in the non-organic layer region 123 due to the clamp unit 121 having a negative side slope.

Figure 3E:
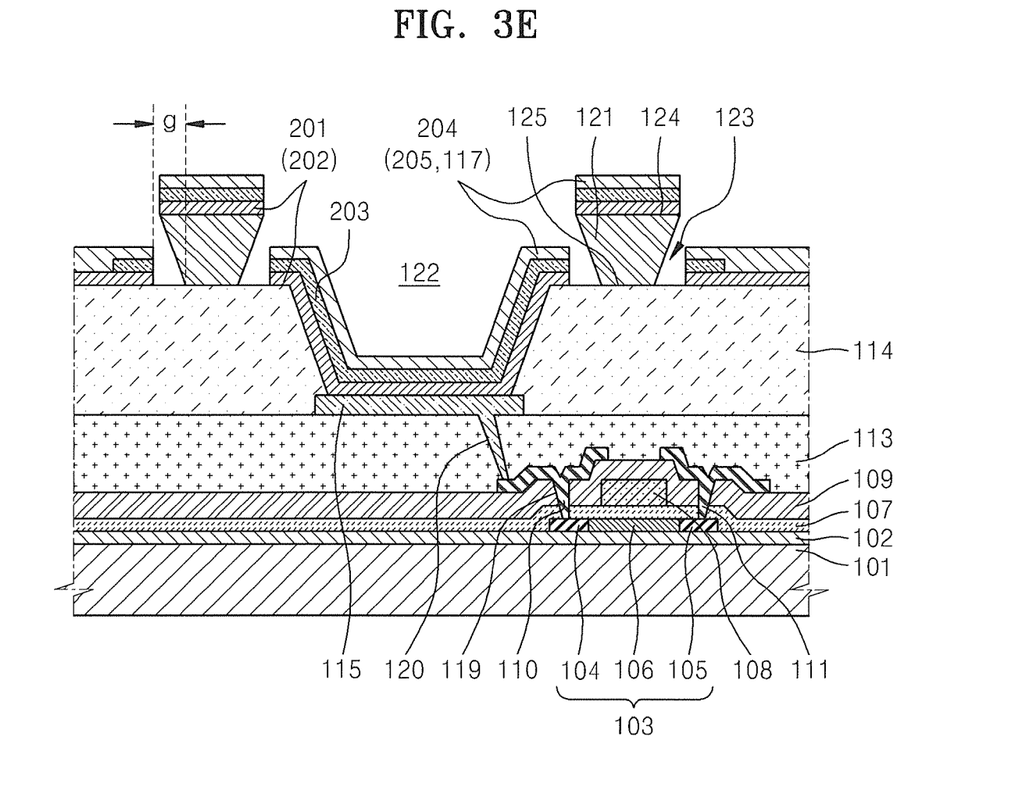
FIG. 3E is a cross-sectional view after formation of an electron transport layer (ETL) and an electron injection layer (EIL) on the substrate of FIG. 3D.

FIG. 3E is a cross-sectional view after formation of the ETL 204 and the EIL 205 on the substrate of FIG. 3D.

Referring to FIG. 3E, the ETL 204, the EIL 205, and the second electrode 117 are sequentially formed on the EML 203. Since the ETL 204, the EIL 205, and the second electrode 117 may be formed as common layers, the ETL 204, the EIL 205, and the second electrode 117 may be formed on the entire surface of the substrate 101 by blanket deposition without using a patterning device such as a mask. As a result, the ETL 204, the EIL 205, and the second electrode 117 are formed on the surface of the EML 203 through the opening 122, and at the same time on the first surface 124 of the clamp unit 121 and the surface of the PDL 114.

Through the above-described processes, the first electrode 115, the HIL 201, the HTL 202, the EML 203, the ETL 204, the EIL 205, and the second electrode 117 are sequentially formed in each subpixel defined by the PDL 114, thereby resulting in an OLED. The ETL 204, the EIL 205, and the second electrode 117 are not formed in the non-organic layer region 123 due to the presence of the clamp unit 121 having a negative side slope.

Figure 3F:
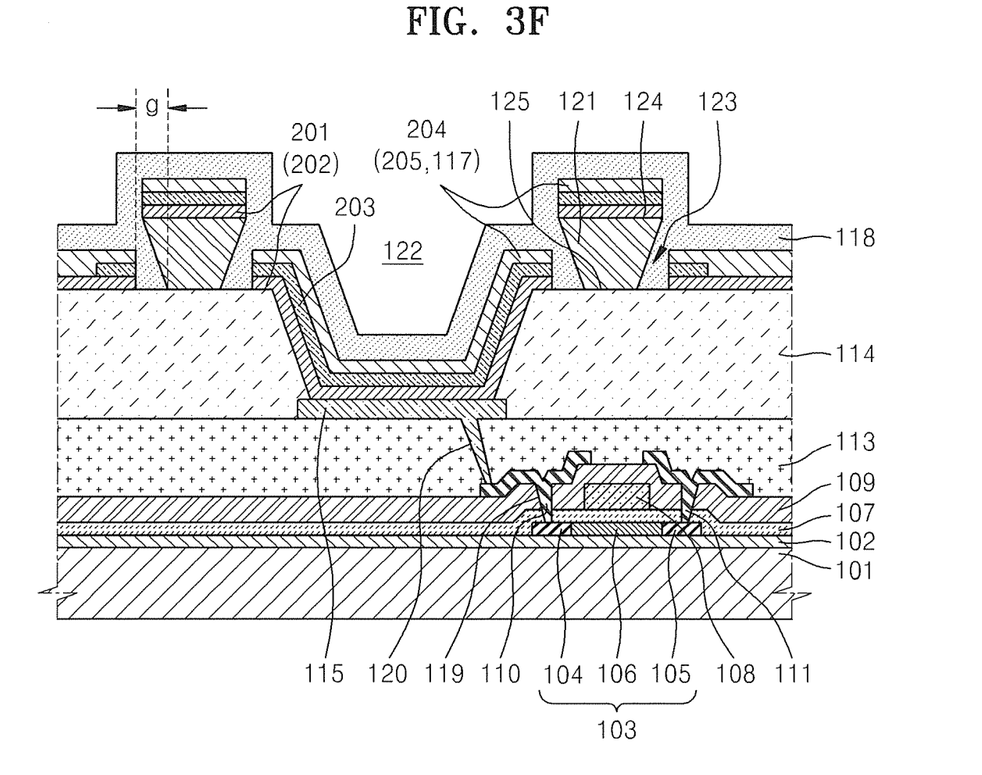
FIG. 3F is a cross-sectional view after formation of a capping layer on the substrate of FIG. 3E.

FIG. 3F is a cross-sectional view after formation of the capping layer 118 on the substrate of FIG. 3E.

Referring to FIG. 3F, a capping layer 118 is formed to cover the OLED and the clamp unit 121. The capping layer 118 may be formed by stacking at least one layer using an organic or inorganic material. The capping layer 118 may be formed using atomic layer deposition for good coverage.

The capping layer 118 may fully cover an upper surface of the OLED and the gap between the clamp unit 121 and the organic layer 116. As a result, the capping layer 118 is connected with the PDL 114.

As described above, the clamp unit 121 having a negative side slope is formed on the upper surface of the PDL 114 that surrounds each subpixel. This allows the non-organic layer region 123, which is a region excluding the organic layer 116, to be formed adjacent to the clamp unit 121. Finally, the capping layer 118 is formed by atomic layer deposition.

Therefore, the clamp unit 121 has a structure that is next to or around each subpixel and connecting the PDL 114 and the capping layer 118. Thus, the clamp unit 121 may support thin film layers lying above and below the organic emission layer 203 that are more likely to be separated during, for example, a bending, folding, or rolling of the flexible display device 100, thereby improving the thin film separation problem.

Figure 4:
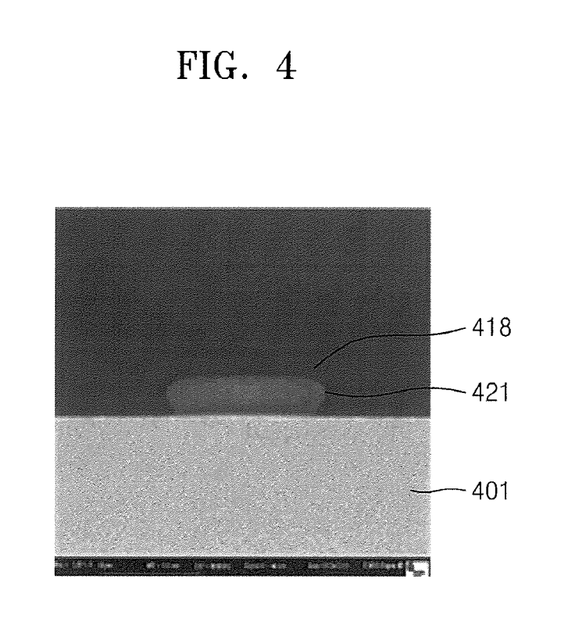
FIG. 4 is a magnified image of a clamp unit according to an embodiment of the present invention.
Figure 5:
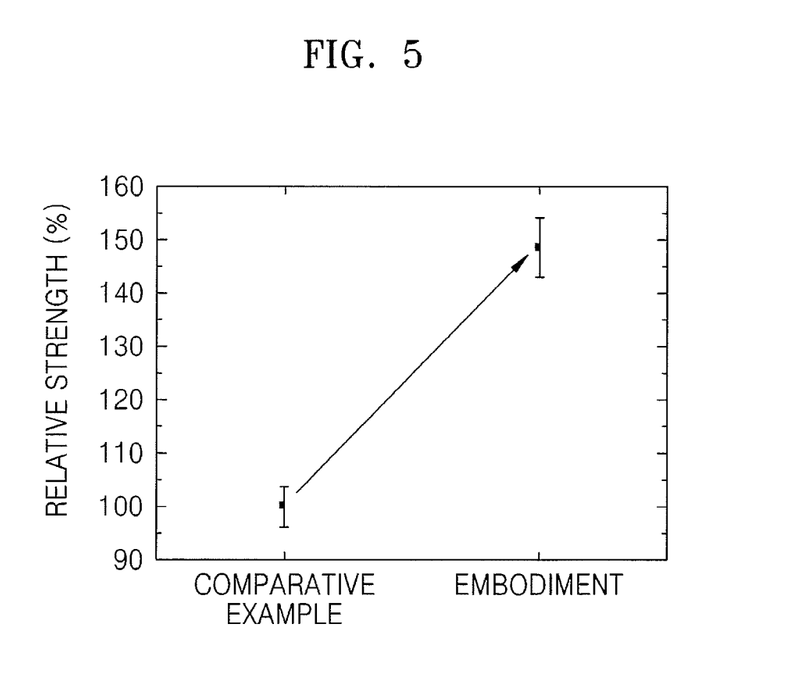
FIG. 5 is a comparative graph of adhesive strength between a spacer of a comparable flexible display device and the clamp unit of FIG. 4.

FIG. 4 is an image of a clamp unit 421 according to an embodiment of the present invention. FIG. 5 is a graph of adhesive strength of the clamp unit 421 measured in an adhesiveness test with that of a spacer of a comparable flexible display device.

Referring to FIG. 4, the clamp unit 421 is disposed on a substrate 401. The clamp unit 421 may have a height of from about 3 micrometers to about 3.5 micrometers (μm), and a width of about 15 micrometers, and a length of about 30 micrometers. In the present embodiment of FIG. 4, the clamp unit 421 may have an inverse tapered shape with a cross-sectional area decreasing from an upper surface toward a lower surface, or from a middle portion (that is, a widest portion between the upper surface and the lower surface) toward the lower surface. The clamp unit 421 may have a negative side slope of from about 10 to about 12 degrees with respect to the vertical direction.

In the adhesiveness test, after formation of the capping layer 418 using $Al_2O_3$ around the clamp unit 421 by atomic layer deposition to a thickness of about 50 nanometers to enable effective clamping by the clamp unit 421, a PET film was attached to the top of the capping layer 418, and then released therefrom to measure adhesive strength of the clamp unit 421.

As a comparative example, a spacer having a positive side slope that is formed from melting of a region irradiated by light during a photo-exposure process was used. The clamp unit 421 of the present embodiment of FIG. 4, which is formed from melting of a region not irradiated by light, has a negative side slope with a cross-sectional area decreasing downwards in the vertical direction.

Referring to FIG. 5, a relative strength of the spacer of the comparative example was about 100%, while that of the clamp unit 421 was about 150%. This indicates that the adhesive strength of the clamp unit 421 having the negative side slope is greater by about 50% as compared with the spacer having the positive side slope.

Figure 6:
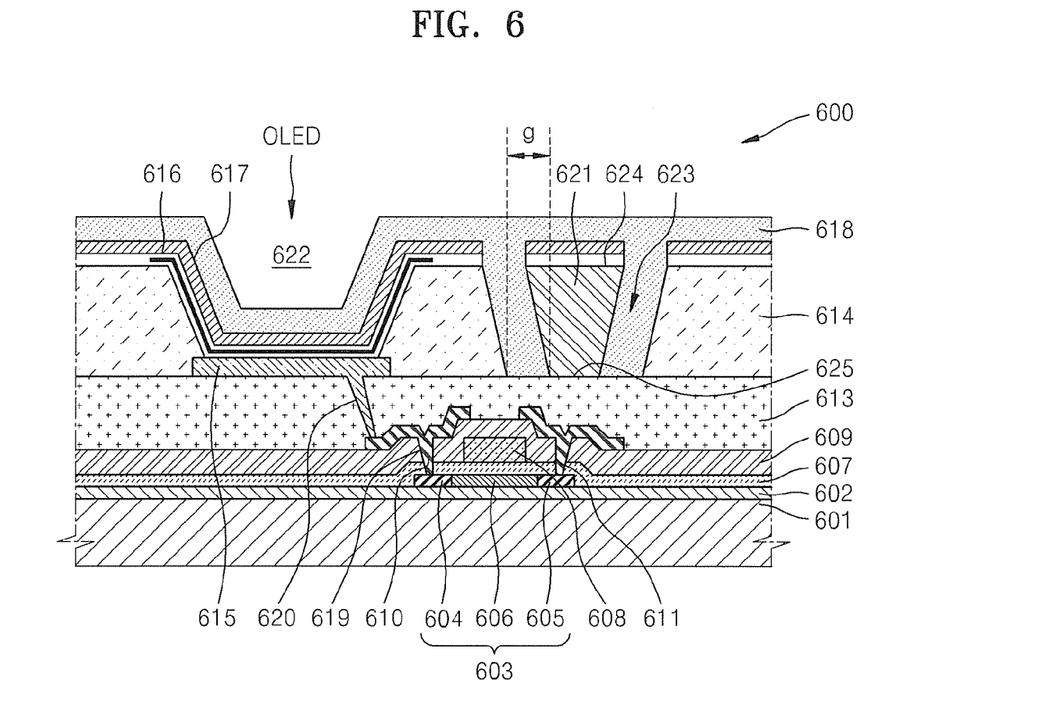
FIG. 6 is a partial cut cross-sectional view illustrating a subpixel of a flexible display device according to another embodiment of the present invention.

FIG. 6 is a cross-sectional view schematically illustrating one subpixel in a flexible display apparatus 600 according to another embodiment of the present invention.

Referring to FIG. 6, the flexible display apparatus 600 includes a substrate 601. A barrier layer 602 is disposed on the substrate 601. A TFT is disposed on the barrier layer 602.

A semiconductor active layer 603 having a pattern (for example, a predetermined pattern) is disposed on the barrier layer 602. A source region 604 and a drain region 605 are formed on the semiconductor active layer 603 by doping with N-type or P-type impurity ions. A channel region 606 undoped with any impurity ion is between the source region 604 and the drain region 605.

The gate insulating layer 607 is deposited on the semiconductor active layer 603. The gate electrode 608 is disposed in a region (for example, a predetermined region) on the gate insulating layer 607. An interlayer insulating layer 609 is disposed on the gate electrode 608. Source/drain electrodes 610 and 611 are electrically connected to the source region 604 and the drain region 605, respectively, via contact holes (for example, a contact hole 619). The contact hole 619 may be formed by selectively removing the gate insulating layer 607 and the interlayer insulating layer 609. A protection layer (a passivation layer and/or a planarization layer) 613 is disposed on the source electrode 610 and the drain electrode 611.

To form an OLED, a first electrode 615 is disposed on the TFT to be electrically connected with one of the source electrode 610 or the drain electrode 611 via the contact hole 620. A PDL 614 is disposed on the protection layer 613 to cover an edge portion of the first electrode 615 of the OLED. An organic layer 616 is disposed on a region of the first electrode 615 that is exposed from partially etching the PDL 614. A second electrode 617 of the OLED is disposed on the organic layer 616.

The first electrode 615 and the second electrode 617 are insulated from each other by the organic layer 616, and respectively apply voltages of opposite polarities to the organic layer 616 to induce light emission in the organic layer 616. For example, when forming the organic layer from a low-molecular weight organic material, a HIL, a HTL, an EML, an ETL, and/or an EIL may be formed on the surface of the first electrode 615 as separate single layers or a combination layer.

A capping layer 618 is disposed on the OLED. The capping layer 618 may be formed as a stack of at least one layer of an organic or inorganic material.

In the embodiment described with reference to FIG. 1, the clamp unit 121 is located in the non-organic layer region 123 that is formed on the PDL 114 that surrounds each subpixel. Accordingly, a patterning mask for depositing an organic material to form the EML 203 may be arranged with a gap (to account for the clamp unit 121) from an actual deposition surface. This gap may cause a shadow effect.

In the present embodiment of FIG. 6, to prevent or reduce the shadow effect, the clamp unit 621 is formed in a non-organic layer region 623 that is formed in the same layer as the PDL 614. This will now be described in further detail below.

The first electrode 615 is disposed as a pattern on the protection layer 613. The first electrode 615 is electrically connected with one of the source electrode 610 or the drain electrode 611 through a contact hole 620.

A region of the first electrode 615 is covered by the PDL 114, and the other region of the first electrode 115 is exposed through an opening 622. The organic layer 616 and the second electrode 617 are disposed on the region of the first electrode 115 that is exposed through the opening 622.

The non-organic layer region 623 is disposed around or next to each subpixel. The non-organic layer region 623 may be formed in a region that is defined by partially removing the PDL 614. The non-organic layer region 623 may be disposed in at least one region around or next each subpixel, for example, at a corner of each unit subpixel, in an intersection area of adjacent subpixels, or in a region between adjacent subpixels.

The clamp unit 621 is in the non-organic layer region 623, and more particularly, in a surface region of the protection layer 613 from which the PDL 614 is partially removed. That is, the clamp unit 621 is formed in the same layer as the PDL 614.

The clamp unit 621 may have a substantially same height as that of the PDL 614. The clamp unit 621 is buried by the capping layer 618. The clamp unit 621 has a negative (−) side slope. That is, the clamp unit 621 has an inverse tapered shape with a decreasing cross-sectional area from a first surface 624 that is an upper surface (or a widest portion) of the clamp unit 621 covered by the capping layer 618, toward a second surface 625 that is a lower surface of the clamp unit 621 and vertically opposite to the first surface 624, and directly contacts the protection layer 613. The clamp unit 621 may be formed from the PDL or from a material that is substantially the same as the material of the PDL 614, for example, a polymer material such as polyimide.

Due to the clamp unit 621 having a negative (−) side slope, the organic layer 616 is not formed in a region adjacent to the clamp unit 621, with a gap (g) between the clamp unit 621 and the PDL 614. The gap (g) is filled with the capping layer 618. The capping layer 618 may be formed using atomic layer deposition for good coverage. The capping layer 618 may be a stack of alternating organic and inorganic material layers.

As described above, since the clamp unit 621 is disposed in the non-organic layer region 623 that is around or next to each subpixel, and the capping layer 618 is formed by atomic layer deposition so that the PDL 614, the capping layer 618, and the protection layer 613 are connected to one another, the thin film separation and shadowing problems may be improved.

Figure 7:
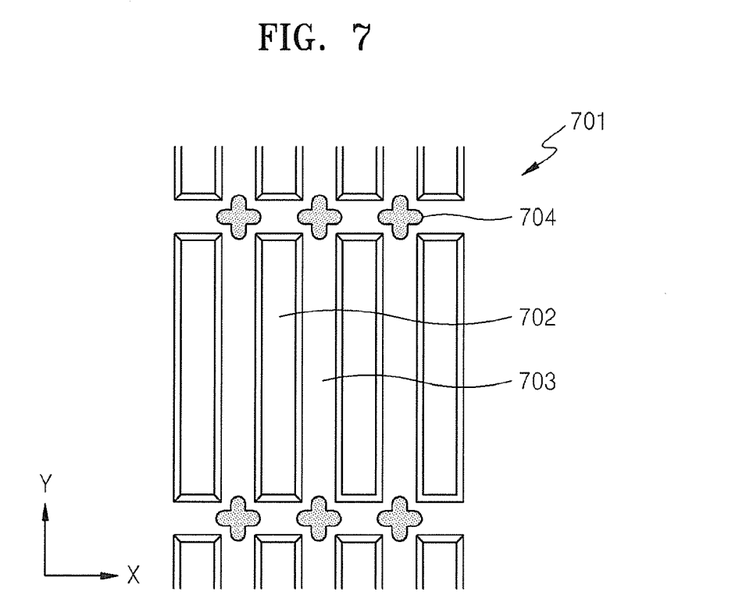
FIG. 7 is a plan view of an arrangement of clamp units near subpixels, according to an embodiment of the present invention.
Figure 8:
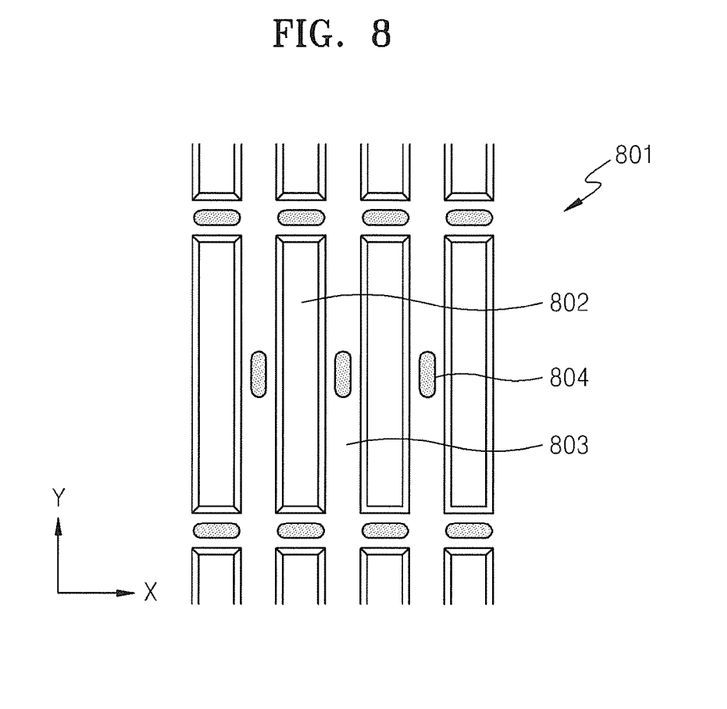
FIG. 8 is a plan view of an arrangement of clamp units near subpixels, according to another embodiment of the present invention.
Figure 9:
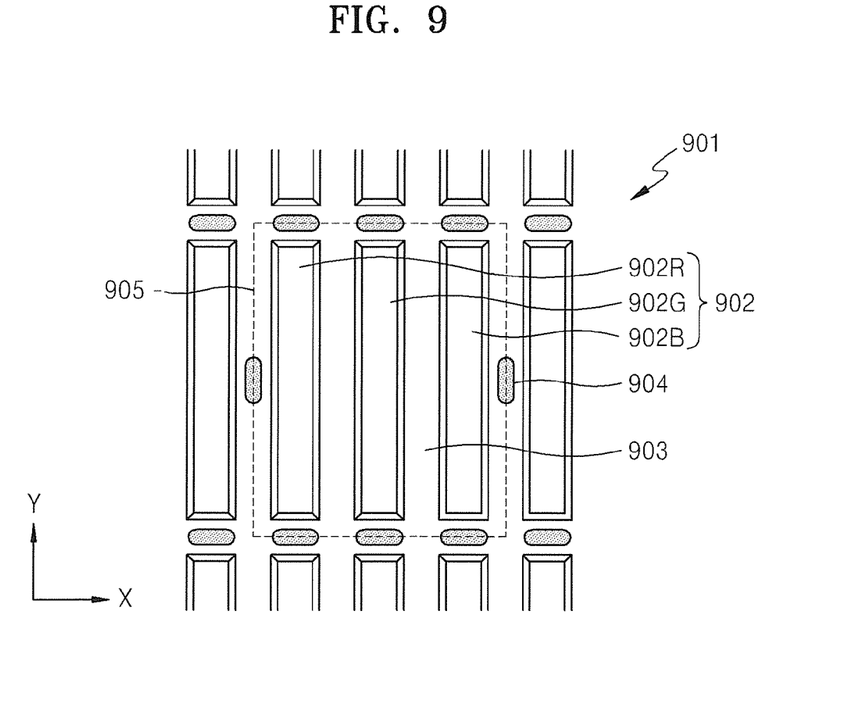
FIG. 9 is a plan view of an arrangement of clamp units near subpixels, according to another embodiment of the present invention.

FIGS. 7 to 9 are plan views illustrating arrangements of clamp units around or next to subpixels, according to embodiments of the present invention.

Referring to FIG. 7, a plurality of subpixels 702 are arranged on a substrate 701. The subpixels 702 are defined by the PDL 703. An EML of red, green, or blue may be formed in each subpixel 702. Although in the present embodiment of FIG. 7, the subpixels 702 have a rectangular shape, the subpixels 702 may have any of a variety of pattern forms, for example, other polygonal shape, a circular shape, or an oval shape.

The subpixels 702 are consecutively arranged in an X-axis direction and a Y-axis direction. A clamp unit 704 may be disposed at each corner of each unit subpixel 702, and more particularly, in a region in which corners of adjacent four subpixels 702 in the X-axis direction and Y-axis direction adjoin one another. This structure with the clamp unit 704 arranged in the adjoining corner region of every four adjacent subpixels 702 may improve the film separation problem in every direction, i.e., upper, lower, left and right directions, when, for example, a flexible display apparatus is folded, bent, or rolled in a direction.

Referring to FIG. 8, a plurality of subpixels 802 defined by the PDL 803 are arranged on a substrate 801. The subpixels 802 are consecutively arranged in the X-axis and Y-axis directions. Although in the present embodiment of FIG. 8, the subpixels 802 have a rectangular shape, the subpixels 802 may have any of a variety of pattern forms, for example, other polygonal shape, a circular shape, or an oval shape.

In the present embodiment of FIG. 8, at least one clamp unit 804 may be disposed along adjoining short sides (i.e., in the X-axis direction) or along adjoining long sides (i.e., in the Y-axis direction) of adjacent subpixels 802. As shown, two clamp units 804 are disposed adjacent to opposite short sides of each unit subpixel 802, and two clamp units 804 are disposed adjacent to opposite long sides of each unit subpixel 802. Since the clamp unit 804 is disposed between each pair of adjacent subpixels 802, the adhesion strength between the capping layer and the PDL 803 may be further increased.

Referring to FIG. 9, a plurality of subpixels 902 defined by the PDL 903 may be disposed on a substrate 901. The subpixels 902 include red subpixels 902R, green subpixels 902G, and blue subpixels 902B that are alternately disposed in the X-axis direction. Although in the present embodiment of FIG. 9, the subpixels 902 have a rectangular shape, the subpixels 902 may have any of a variety of pattern forms, for example, other polygonal shape, a circular shape, or an oval shape.

In the embodiments described with reference to FIGS. 7 and 8, in which the clamp unit 704 or 804 is disposed adjacent to each subpixel, an excess number of clamp units 704 or 804 may serve as resistance against power supply from a second electrode formed as a cathode at an edge of a panel. Accordingly, in the present embodiment of FIG. 9, a plurality of clamp units 904 may be disposed around or next to each pixel 905 including a red subpixel 902R, a green subpixel 902G, and a blue subpixel 902B. This structure may reduce the number of clamp units 904, and at the same time, may further enhance the adhesion strength between the capping layer and the PDL 903 when a flexible display device is, for example, folded, bent, or rolled in upper, lower, left, or right directions.

As described above, according to one or more embodiments of the present invention, in a flexible display apparatus and a method of manufacturing the flexible display apparatus, a non-organic layer region is defined around or next to subpixels, and a clamp unit is formed in the non-organic layer region to bind upper and lower thin film layers adjacent to the clamp unit, thereby increasing adhesion strength between the thin film layers. Thus, reliability of the flexible display apparatus may be improved.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. An organic light-emitting display apparatus comprising a substrate and having a plurality of subpixels on the substrate, the organic light-emitting display apparatus further comprising:
    a thin film transistor on the substrate;
    an organic light-emitting device electrically connected to the thin film transistor and in one of the subpixels, the organic light-emitting device comprising a first electrode, an organic layer on the first electrode, and a second electrode on the organic layer;
    a pixel defining layer having an opening that exposes a region of the first electrode, and covering an edge region of the first electrode to define an emission area of the one of the subpixels;
    a capping layer covering the organic light-emitting device; and
    at least one clamp unit next to the emission area of the one of the subpixels, wherein the at least one clamp unit is not formed on the organic layer,
    wherein a surface region of the pixel defining layer surrounds the one of the subpixels and is buried by the capping layer,
    wherein a gap exposing the surface region of the pixel defining layer is between the organic layer and the at least one clamp unit, and
    wherein the gap is filled with the capping layer so that the pixel defining layer and the capping layer directly contact each other.

2. The organic light-emitting display apparatus of claim 1, wherein the at least one clamp unit is on DA the surface region of the pixel defining layer.

3. The organic light-emitting display apparatus of claim 2, wherein the at least one clamp unit has an inverse tapered shape with a negative side slope.

4. The organic light-emitting display apparatus of claim 3, wherein the at least one clamp unit has a cross-sectional area decreasing from a first surface toward a second surface that is vertically opposite to the first surface and contacts the pixel defining layer.

5. The organic light-emitting display apparatus of claim 3, wherein the at least one clamp unit has a first surface, a second surface that is vertically opposite to the first surface and contacts the pixel defining layer, a widest portion between the first surface and the second surface, and a cross-sectional area decreasing from the widest portion toward the second surface.

6. The organic light-emitting display apparatus of claim 1, wherein the capping layer is formed by atomic layer deposition.

7. The organic light-emitting display apparatus of claim 1, wherein the capping layer is a hybrid layer of alternating organic and inorganic material layers.

8. The organic light-emitting display apparatus of claim 1, wherein
    the pixel defining layer defines the subpixels, and
    the at least one clamp unit is at a corner of each of adjacent ones of the subpixels.

9. The organic light-emitting display apparatus of claim 1, wherein
    the pixel defining layer defines the subpixels, and
    the at least one clamp unit is between adjacent ones of the subpixels.

10. The organic light-emitting display apparatus of claim 1, further comprising a plurality of pixels on the substrate, each of the pixels comprising a red one of the subpixels, a green one of the subpixels, and a blue one of the subpixels, wherein
    the pixel defining layer is between adjacent ones of the subpixels, and
    the at least one clamp unit is between adjacent ones of the pixels.

11. An organic light-emitting display apparatus comprising a substrate and having a plurality of subpixels on the substrate, the organic light-emitting display apparatus further comprising:
    a thin film transistor on the substrate;
    an organic light-emitting device electrically connected to the thin film transistor and in one of the subpixels, the organic light-emitting device comprising a first electrode, an organic layer on the first electrode, and a second electrode on the organic layer;
    a pixel defining layer having an opening that exposes a region of the first electrode, and covering an edge region of the first electrode to define an emission area of the one of the subpixels;
    a capping layer covering the organic light-emitting device
    at least one clamp unit next to the emission area of the one of the subpixels, wherein the at least one clamp unit is not formed on the organic layer; and
    a protection layer under the pixel defining layer to planarize an upper surface of the thin film transistor,
    wherein the at least one clamp unit is on an exposed surface region of the protection layer in which the pixel defining layer is not present,
    wherein a gap exposing the surface region of the protection layer is between the pixel defining layer and the at least one clamp unit, and is filled with the capping layer so that the pixel defining layer, the capping layer, and the protection layer directly contact one another.

12. The organic light-emitting display apparatus of claim 11, wherein the pixel defining layer and the at least one clamp unit are formed in a same layer.

13. The organic light-emitting display apparatus of claim 11, wherein the at least one clamp unit is formed on the exposed surface region of the protection layer, and is buried by the capping layer.

14. The organic light-emitting display apparatus of claim 13, wherein the at least one clamp unit has an inverse tapered shape with a negative side slope.

15. The organic light-emitting display apparatus of claim 14, wherein the at least one clamp unit has a cross-sectional area decreasing from a first surface toward a second surface that is vertically opposite to the first surface and contacts the protection layer.

16. The organic light-emitting display apparatus of claim 14, wherein the at least one clamp unit has a first surface, a second surface that is vertically opposite to the first surface and contacts the protection layer, a widest portion between the first surface and the second surface, and a cross-sectional area decreasing from the widest portion toward the second surface.

* * * * *